United States Patent
Huang et al.

(10) Patent No.: US 12,272,689 B2
(45) Date of Patent: Apr. 8, 2025

(54) SEMICONDUCTOR STRUCTURE WITH COMPOSITE OXIDE LAYER

(71) Applicant: Taiwan Semiconductor Manufacturing Company, Ltd., Hsinchu (TW)

(72) Inventors: Yuan-Sheng Huang, Taichung (TW); Ryan Chia-Jen Chen, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 424 days.

(21) Appl. No.: 17/389,685

(22) Filed: Jul. 30, 2021

(65) Prior Publication Data
US 2023/0031993 A1    Feb. 2, 2023

(51) Int. Cl.
*H01L 27/088* (2006.01)
*H01L 21/8234* (2006.01)
*H01L 29/66* (2006.01)

(52) U.S. Cl.
CPC .. *H01L 27/0886* (2013.01); *H01L 21/823431* (2013.01); *H01L 21/823481* (2013.01); *H01L 29/66742* (2013.01)

(58) Field of Classification Search
CPC ......... H01L 27/0886; H01L 21/823431; H01L 21/823462; H01L 29/66795; H01L 29/785; H01L 29/66545
See application file for complete search history.

(56) References Cited

U.S. PATENT DOCUMENTS

| | | | |
|---|---|---|---|
| 9,576,980 B1* | 2/2017 | Basker | H01L 29/517 |
| 2016/0133744 A1* | 5/2016 | Zhao | H01L 29/495 |
| | | | 257/401 |
| 2017/0033013 A1* | 2/2017 | Kim | H01L 21/30604 |
| 2020/0395458 A1* | 12/2020 | Ando | H01L 21/31111 |

* cited by examiner

*Primary Examiner* — Tuan A Hoang
(74) *Attorney, Agent, or Firm* — FOLEY & LARDNER LLP (57) ABSTRACT

A semiconductor structure and method for fabricating a semiconductor structure includes using two separate oxide layers to improve device reliability. A first oxide layer is formed adjacent a fin (e.g. a fin of a fin field-effect transistor (FinFET) device), a dummy gate is formed adjacent the first oxide layer, the dummy gate is removed, and a second oxide layer is then formed adjacent the first oxide layer. The use of the second oxide layer can improve device reliability by covering any damage that may be inflicted on the first oxide layer when the dummy gate is removed.

20 Claims, 9 Drawing Sheets

SEMICONDUCTOR STRUCTURE WITH COMPOSITE OXIDE LAYER

BACKGROUND

The present disclosure generally relates to semiconductor devices and methods for fabricating semiconductor devices, and particularly to formation of insulating layers near gate terminals of transistor devices. These insulating layers can be damaged during the fabrication process, thereby leading to problems with respect to device reliability. Semiconductor devices are used in a wide variety of electronics, and improvements regarding both production and performance of semiconductor devices are generally desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a semiconductor structure and method for fabricating a semiconductor structure including use of two separate oxide layers to improve device reliability. A first oxide layer is formed adjacent a fin (e.g. a fin of a fin field-effect transistor (FinFET) device), a dummy gate is formed adjacent the first oxide layer, the dummy gate is removed, and a second oxide layer is then formed adjacent the first oxide layer. The use of the second oxide layer can improve device reliability by covering any damage that may be inflicted on the first oxide layer when the dummy gate is removed.

Figure 1:
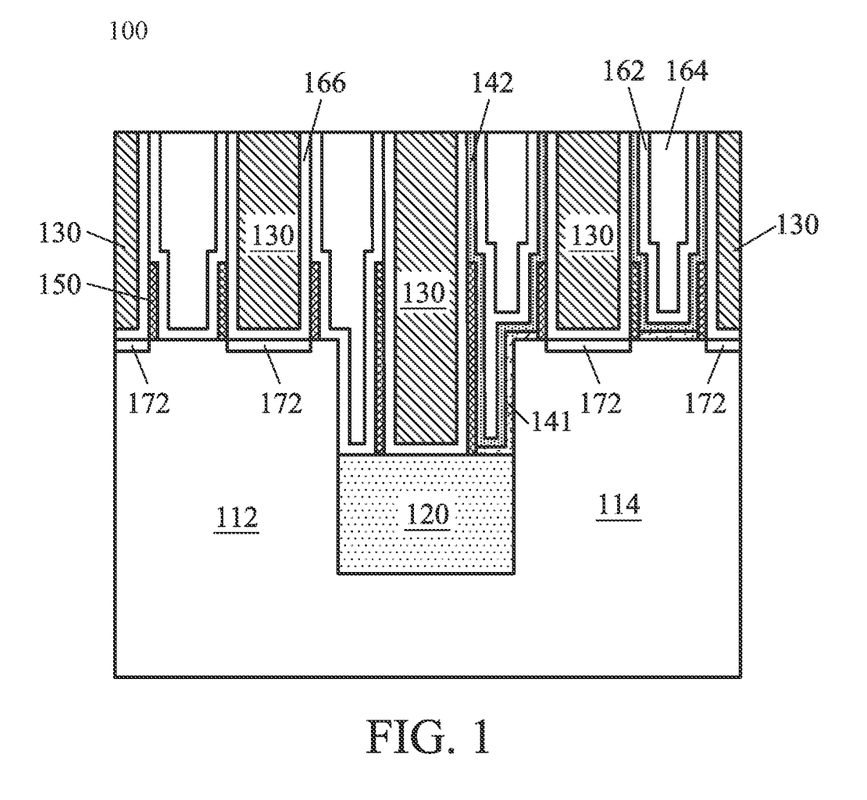
FIG. 1 illustrates a cross section of an example semiconductor structure, in accordance with some embodiments.

Referring now to FIG. 1, a cross section of an example semiconductor structure 100 is shown, in accordance with some embodiments. Semiconductor structure 100 is generally a fin field-effect transistor (FinFET) structure. However the approaches described herein can also be implemented in other transistor structures such as gate-all-around field-effect transistor (GAAFET) structures, and other similar types of transistor structures. Semiconductor structure 100 is generally be implemented in an integrated circuit (IC). Semiconductor structure 100 is generally formed during the front-end-of-line (FEOL) process of the IC fabrication process. Semiconductor structure 100 includes a composite oxide layer for improving device reliability, as discussed in more detail below.

During the fabrication process, various removal processes (e.g. wet etching, dry etching, chemical-mechanical planarization) can cause unwanted damage to underlying layers and materials in semiconductor structure 100. For example, when forming semiconductor structure 100, a dummy gate structure (e.g. dummy gate 160 discussed below) can be formed using polysilicon material and the subsequently removed. When the dummy gate is removed, unintended damage to underlying insulating layers (e.g. oxide layers) can occur as a result of the rather intensive process needed to remove the dummy gate. In some instances, this unwanted damage can create problems in terms of device reliability. These problems can include charge leakage, weak electrical connections, and individual device failures. As a result, device yield and performance can be negatively affected.

Semiconductor structure 100 is shown to include a core fin 112. Core fin 112 is an active fin of semiconductor structure 100 that is formed of semiconductor material and provides a pathway for electric current to flow through semiconductor structure 100. Core fin 112 can be formed using materials such as silicon (Si), silicon germanium (SiGe), and other suitable conductive materials and combinations thereof. Core fin 112 serves as a fin of FinFET device and generally operates at a relatively low voltage, such as 1.2V or less. Core fin 112 extends above isolation structure 120, as discussed in more detail below. Notably, the first oxide layer 141 and the second oxide layer 142 (discussed below) are not formed adjacent core fin 112. Rather, a gate of semiconductor structure 100 is formed adjacent core fin 112, as discussed in more detail below.

Semiconductor structure 100 is also shown to include an input/output fin 114. Input/output fin 114 is an active fin of semiconductor structure 100 that is formed of semiconductor material and provides a pathway for electric current to flow through semiconductor structure 100. Input/output fin 114 can be formed using materials such as silicon (Si), silicon germanium (SiGe), and other suitable conductive materials and combinations thereof. Input/output fin 114 serves as a fin of FinFET device and generally operates at a relatively high voltage, such as greater than or equal to 1.2V. Accordingly, core fin 112 operates at a first voltage and input/output fin 114 operates at a second voltage, and the second voltage is greater than the first voltage. Input/output fin 114 also extends above isolation structure 120. Notably, the first oxide layer 141 and the second oxide layer 142 (discussed below) are formed adjacent input/output fin 114, unlike core fin 112.

Semiconductor structure 100 is also shown to include an isolation structure 120. Isolation structure 120 generally prevents leakage of electric current between components of semiconductor structure 100. Isolation structure 120 can be implemented as a shallow trench isolation (STI) structure, for example. Isolation structure 120 can be formed by creating trenches within a substrate of semiconductor structure 100 (e.g. a bulk silicon substrate or another type of substrate), filling the trenches with insulating material (e.g. dielectric material such as silicon dioxide), and removing excess insulating material using processes such as chemical-mechanical polishing (CMP). Isolation structure 120 in addition to a substrate of semiconductor structure 100 can generally provide a base for forming other components of semiconductor structure 100 thereon.

Semiconductor structure 100 is also shown to include a dielectric layer 130. Dielectric layer 130 generally provides electrical isolation of a gate formed in semiconductor structure 100 (not shown in FIG. 1). Dielectric layer 130 can be implemented as an inter-layer dielectric (ILD) structure, for example. Dielectric layer 130 can be formed using dielectric materials with a high dielectric constant (high-k materials), dielectric materials with a low dielectric constant (low-k materials), or a combination thereof, including materials such silicon dioxide ($SiO_2$), silicon oxynitride (SiON), silicon nitride ($Si_3N_4$), silicon carbon nitride (SiCN), silicon oxycarbonitride (SiOCN), hafnia ($HfO_2$), tantalum nitride (TaN), and other suitable materials and combinations thereof. Dielectric layer 130 can be formed using a variety of suitable deposition processes, including physical vapor deposition, chemical vapor deposition, electrochemical deposition, atomic layer deposition, and other suitable processes and combinations thereof. The dielectric layer 130 may have a contact etch stop layer (CESL) 166 formed thereon, where the CESL 166 is formed on a bottom surface and side surfaces of the dielectric layer 130. The CESL 166 may be formed of an oxide or nitride, for example, and can be formed using a variety of suitable deposition processes, including physical vapor deposition, chemical vapor deposition, electrochemical deposition, atomic layer deposition, and other suitable processes and combinations thereof.

Semiconductor structure 100 is also shown to include a first oxide layer 141. The first oxide layer 141 can be formed using suitable materials such as silicon dioxide. As illustrated in FIG. 1, the first oxide layer 141 is formed adjacent input/output fin 114, isolation structure 120, and the dielectric layer including both dielectric layer 130 and spacer layer 150. The first oxide layer protects input/output fin 114 in the final device structure as well as during the fabrication process, and isolates input/output fin 114 from other fins in semiconductor structure 100. As discussed in more detail below, the first oxide layer 141 is notably formed before the formation of dummy gate 160. Through use of the second oxide layer 142 discussed below, the first oxide layer 141 can be made thinner, and thereby the spacing between fins in semiconductor structure 100 can be enlarged. Further, the use of the second oxide layer 142 can prevent the first oxide layer 141 from being damaged during the fabrication process. The first oxide layer 141 can be formed using a variety of suitable deposition processes, including physical vapor deposition, chemical vapor deposition, electrochemical deposition, atomic layer deposition, and other suitable processes and combinations thereof. If the first oxide layer is formed by a deposition process, the first oxide layer 141 may be formed on top surface of the isolation structure 120. However, if the first oxide layer 141 is formed by thermal oxidation, the first oxide layer 141 may not be formed on the top surface of the isolation structure 120.

Semiconductor structure 100 is also shown to include a second oxide layer 142. The second oxide layer 142 can be formed using suitable materials such as silicon dioxide. Like the first oxide layer 141, the second oxide layer 142 also protects input/output fin 114 in the final device structure as well as during the fabrication process, and isolates input/output fin 114 from other fins in semiconductor structure 100. As discussed in more detail below, the second oxide layer 142 is notably formed after dummy gate 160 is formed and removed. Accordingly, the second oxide layer 142 can cover any damages that may occur to the first oxide layer 141 during the process of forming and removing dummy gate 160. Together, the first oxide layer 141 and the second oxide layer 142 form a composite oxide layer in the final device structure that can improve device reliability, as discussed herein. The second oxide layer 142 can be formed using a variety of suitable deposition processes, including physical vapor deposition, chemical vapor deposition, electrochemical deposition, atomic layer deposition, and other suitable processes and combinations thereof.

Semiconductor structure 100 is also shown to include a spacer layer 150. Spacer layer 150 generally provides further electrical isolation of a gate formed in semiconductor structure 100. Spacer layer 150 can be formed using dielectric materials with a high dielectric constant (high-k materials) such as silicon dioxide, silicon nitride, and other suitable materials and combinations thereof. Spacer layer 150 can be implemented as a single layer or using multiple layers. For example, spacer layer 150 can be implemented using multiple layers including both silicon nitride and silicon dioxide. Spacer layer 150 can help prevent charge leakage to improve data retention and device performance. Dielectric layer 130 and spacer layer 150 collectively form a single dielectric layer that includes multiple parts. Spacer layer 150 can be formed using a variety of suitable deposition processes, including physical vapor deposition, chemical vapor deposition, electrochemical deposition, atomic layer deposition, and other suitable processes and combinations thereof. A portion of the composite oxide, the first oxide layer 141 and the second oxide layer 142 together, may be thicker on a sidewall of the input fin 114 than on the spacer layer 150.

It will be appreciated that semiconductor structure 100 can include additional and/or different layers and materials beyond what is expressly illustrated in FIG. 1. For example, additional insulating layers and other types of layers and materials can be formed in semiconductor structure beyond what is expressly illustrated in FIG. 1. Further, it will be appreciated that the illustration provided in FIG. 1 is an example cross section of semiconductor structure 100 during the fabrication process, and the example cross section provided in FIG. 1 is not the final device structure. For example, the final device structure will further include a gate terminal, as well as source and drain terminals for individual semiconductor devices (e.g. individual transistors).

The gate can be implemented as a high-k metal gate (HKMG) structure, for example, where a stack including conductive metal material and dielectric material with a high dielectric constant (high-k) is formed. The stack can also include a work function layer, a capping layer, and/or other layers to form a suitable HKMG structure for the intended application. The HKMG structure can be formed using a variety of suitable processes, including both gate-first and gate-last implementations. In some applications, the use of a HKMG structure as compared to the use of a polysilicon gate can provide reduced charge leakage and thereby improved performance. However, it will be appreciated that the techniques described herein can also be applied to semiconductor devices with polysilicon gate structures, among other types of gate structures. FIG. 1, for example, illustrates a HK layer 162, such as $HfO_2$, formed over the second dielectric layer 142, followed by formation of metal gate 164 on the HK layer 162. Following the deposition of the HK layer 162 and the metal gate 164, a polishing process may be performed, such as CMP, such that the top surfaces of the second dielectric layer 142, the HK layer 162 and the metal gate 164 are coplanar.

The source and drain terminals 172 can be formed using epitaxial material and an epitaxial growth process such as vapor-phase epitaxy (VPE), molecular-beam epitaxy (MBE), liquid-phase epitaxy (LPE), and other suitable processes and combinations thereof. The epitaxial material may then be doped in different regions using suitable dopants, including both n-type and p-type dopants such as arsine, phosphine, diborane, and other suitable dopants and combinations thereof. The IC fabrication process further includes formation of conductive contacts on the gate, source, and drain terminals, as well as formation of interconnect structures (e.g. during the mid-end-of-line (MEOL) process and the back-end-of-line (BEOL) process) and packaging.

Figure 2A:
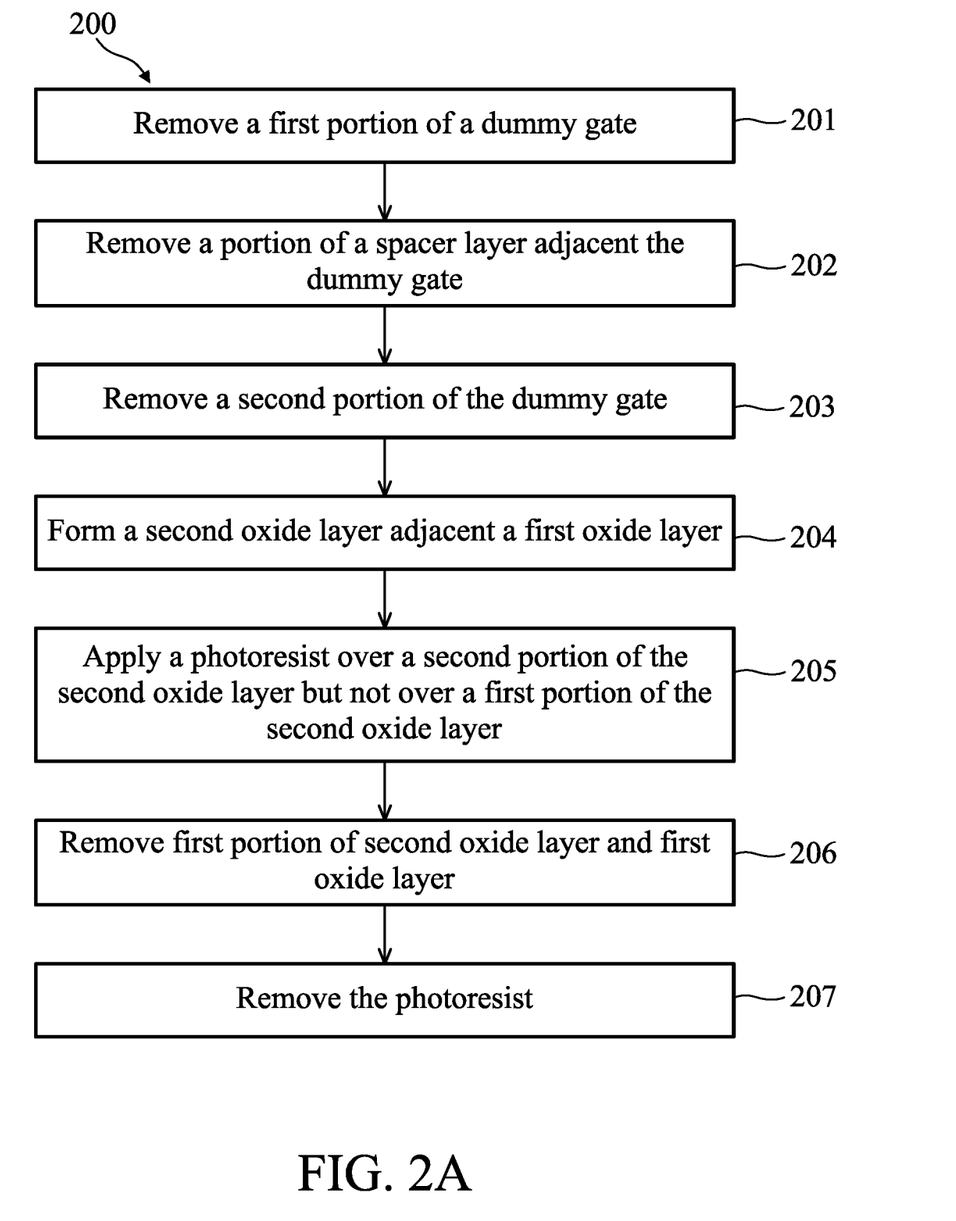
FIG. 2A is a flow chart illustrating an example process for fabricating the semiconductor structure of FIG. 1, in accordance with some embodiments.

Referring now to FIG. 2A, a flow diagram illustrating an example process 200 for fabricating semiconductor structure 100 is shown, in accordance with some embodiments. FIGS. 2B-2H illustrate example cross sections of semiconductor structure 100 at each step of process 200. Process 200 generally includes formation of a composite oxide layer adjacent input/output fin 114, wherein the first oxide layer 141 is formed before dummy gate 160 is formed and removed, and the second oxide layer 142 is formed after dummy gate 160 is formed and removed. The composite oxide layer formed using process 200 can provide improved device reliability by covering any damages that may be inflicted on the first oxide layer 141 during the process of forming and removing dummy gate 160.

Figure 2B:
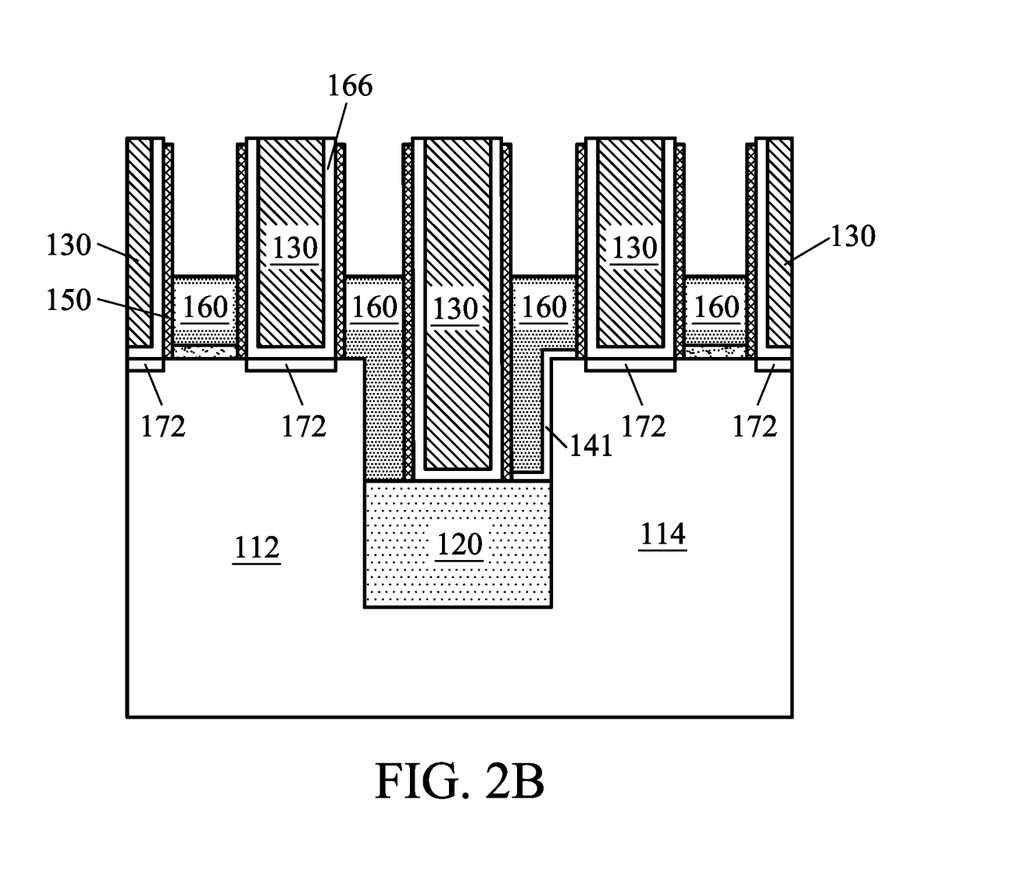
FIGS. 2B-2H illustrate cross sections of the semiconductor structure of FIG. 1 at each step in the process of FIG. 2A, in accordance with some embodiments.

At a step 201, a first portion of a dummy gate is removed (FIG. 2B). As illustrated in FIG. 2B, a first portion of a dummy gate 160 is removed. Dummy gate 160 can be formed using a variety of suitable deposition processes, including physical vapor deposition, chemical vapor deposition, electrochemical deposition, atomic layer deposition, and other suitable processes and combinations thereof before step 201 occurs. Dummy gate 160 can be formed using polysilicon among other suitable materials and combinations thereof. As illustrated in FIG. 2B, dummy gate 160 is formed adjacent the first oxide layer 141 and spacer layer 150. The use of dummy gate 160 can facilitate improvement in the fabrication process and ultimately the formation of an active gate structure, such as a HKMG structure as discussed above. For example, use of dummy gate 160 can facilitate improvements in terms of patterning spacer layer 150 and other similar layers. As the size of semiconductor devices continues to decrease, these improvements facilitated by the use of dummy gate 160 can be significant. Before step 201, the top surface of dummy gate 160 can be even with the top surface of dielectric layer 130, for example. However, in step 201, the first portion of dummy gate 160 is removed in accordance with the desired patterning of spacer layer 150, for example. The first portion of dummy gate 160 can be removed in step 201 using a variety of suitable processes including both wet etching and dry etching processes.

After step 201, pre-cleaning processes can be performed before process 200 continues to step 202. For example, the top surface of dummy gate 160 can be cleaned using solutions such as diluted hydrofluoric acid (DHF) to prepare dummy gate 160 for further removal in step 203 discussed below. Further, spacer layer 150 can be pre-cleaned using solution such as DHF before removal in step 202 discussed below. The pre-cleaning of these materials after step 201 can facilitate a more complete removal of these materials such that residue is not left behind and underlying layers and materials are not damaged during removal.

Figure 2C:
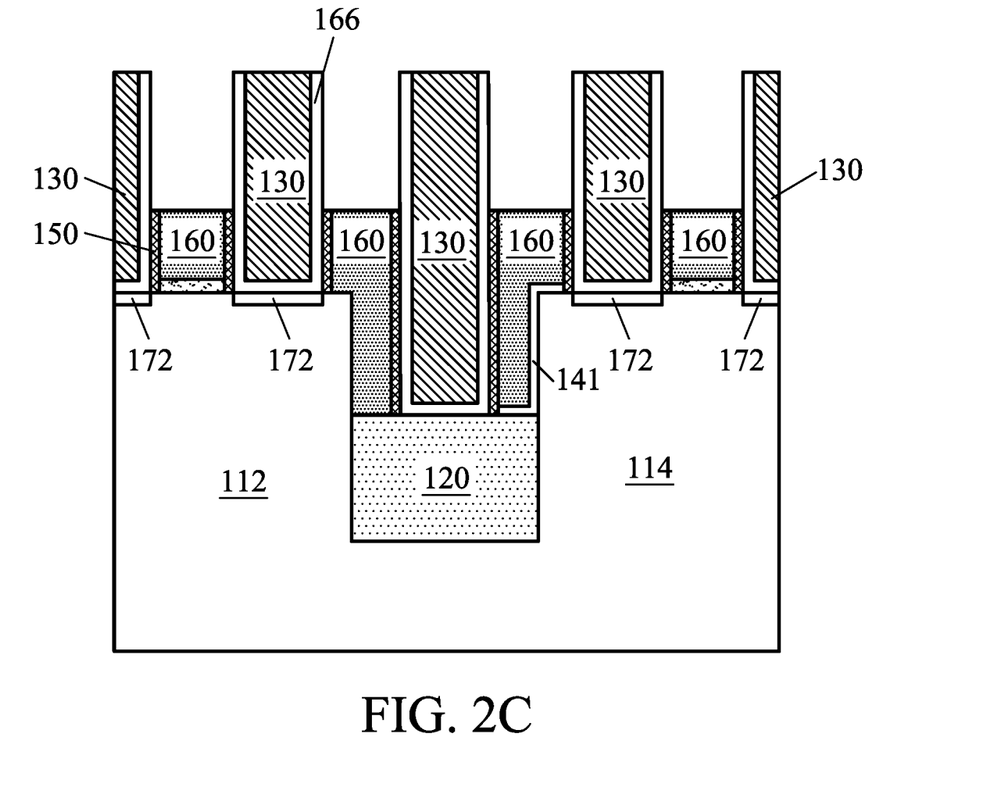

At a step 202, a portion of a spacer layer adjacent the dummy gate is removed (FIG. 2C). As illustrated in FIG. 2C, a portion of spacer layer 150 is removed such that the top surface of spacer layer 150 is even with the top surface of dummy gate 160. In this manner, the removal of the first portion of dummy gate 160 in step 210 be used to control the height of spacer layer 150 in this removal step 202. The portion of spacer layer 150 can be removed in step 202 using a variety of suitable processes including both wet etching and dry etching processes. Step 202 in some cases may be referred to as a spacer pull back (SPB) step. Because the spacer layer 150 is pulled back, portions of the second oxide layer may extend to the top surface of the spacer layer 150, which has been pulled back and reduced in height, as shown for example in FIGS. 2E and 1, for example.

Figure 2D:
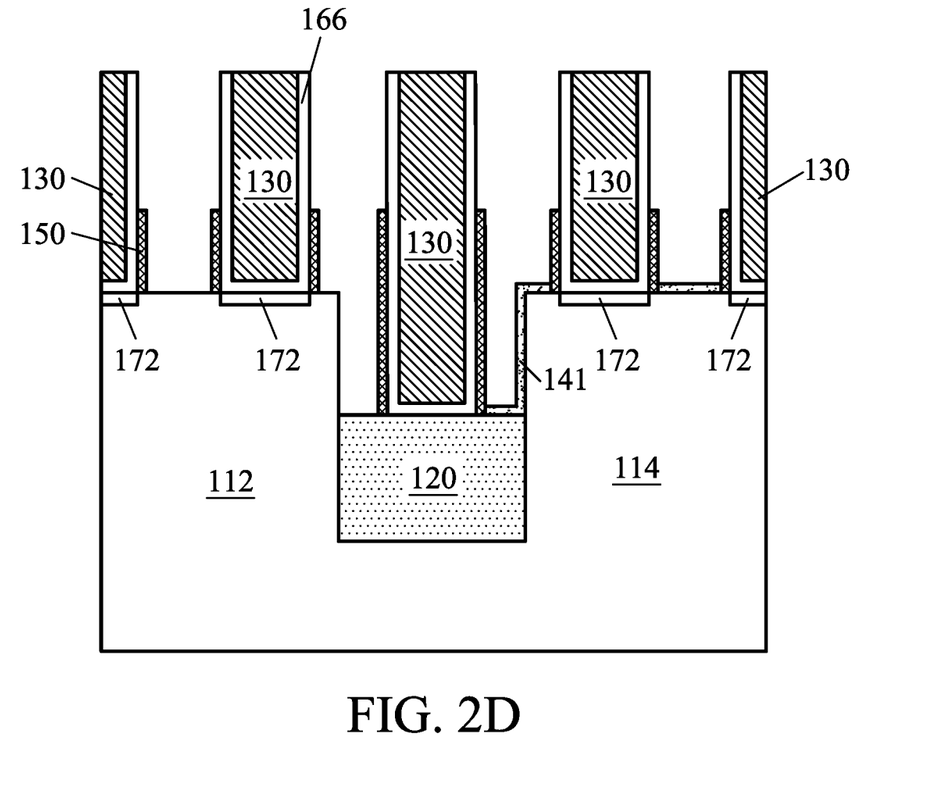

At a step 203, a second portion of the dummy gate is removed (FIG. 2D). As illustrated in FIG. 2D, dummy gate 160 is entirely removed from semiconductor structure 100. In some embodiments, step 203 is broken up into two steps: a dry etching step and a wet etching step. The dry etching step can be used to remove a majority of the remaining material of dummy gate 160, and then the wet etching step can be used to more carefully and cleanly remove the remaining material from dummy gate 160 that remains adjacent the first oxide layer 141. However, especially in semiconductor devices with very small feature sizes, the removal of dummy gate 160 in step 203 may not be perfect. For example, some residue (e.g. polysilicon residue) may remain on the surface of the first oxide layer and/or the sidewall of spacer layer 150, and/or damage may be inflicted on the first oxide layer 141. The second portion of dummy gate 160 can be removed in step 203 using a variety of different numbers of steps and a variety of suitable processes including both wet etching and dry etching processes.

Figure 2E:
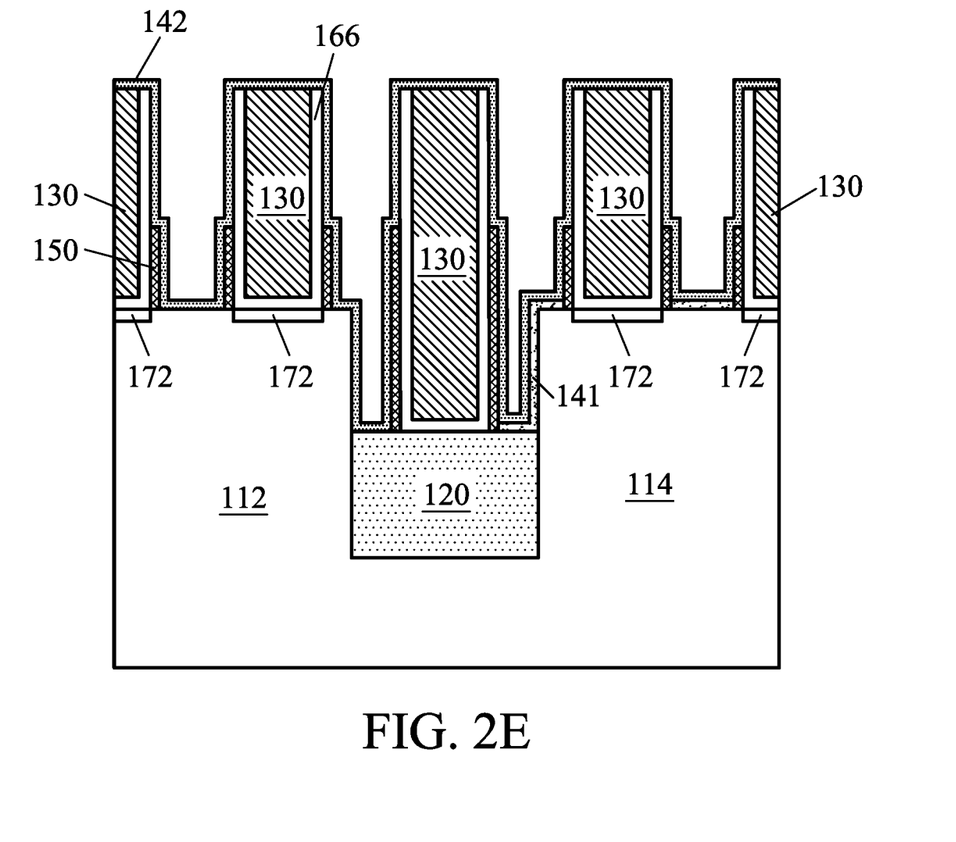

At a step 204, a second oxide layer is formed adjacent the first oxide layer (FIG. 2E). As illustrated in FIG. 2E, the second oxide layer 142 is formed adjacent the first oxide layer 141. The second oxide layer 142 can be formed using a variety of suitable deposition processes, including physical vapor deposition, chemical vapor deposition, electrochemical deposition, atomic layer deposition, and other suitable processes and combinations thereof. The formation of the second oxide layer 142 over the first oxide layer 141 can cover up any damage that may have occurred to the first oxide layer 141 as a result of removing the second portion of dummy gate 160 in step 203. Together, the first oxide layer 141 and the second oxide layer 142 form a composite oxide layer. This composite oxide layer provides a stronger and more consistent oxide layer for protecting and isolating input/output fin 114. Further, the second oxide layer 142 can be formed such that it is thicker than the first oxide layer 141. This allows the first oxide layer 141 to be made thinner, thereby enlarging the process window for forming and removing dummy gate 160 as well as enlarging the spacing between fins in semiconductor structure 100.

After step 204, additional cleaning processes may be performed to prepare various materials in semiconductor structure 100 for application of a photoresist in step 205, discussed below. For example, the surface of the second oxide layer 142 can be cleaned in a region of semiconductor structure 100 associated with input/output fin 114. The cleaning step or steps can be performed using a variety of suitable solutions and processes, including using DHF acid as discussed above and/or polishing processes such as chemical-mechanical planarization.

Figure 2F:
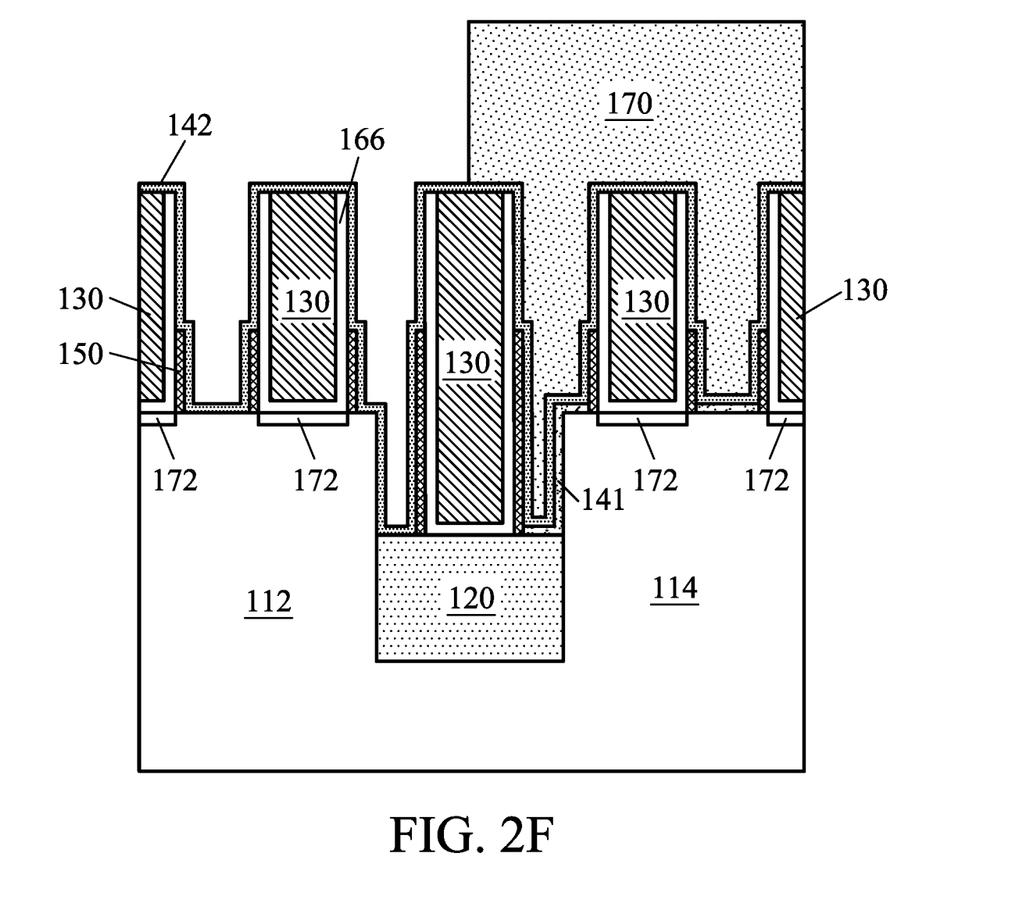

At a step 205, a photoresist is applied over a second portion of the second oxide layer but not over a first portion of the second oxide layer (FIG. 2F). As illustrated in FIG. 2F, a photoresist 170 is applied over the surface of the second oxide layer 142 in a region of semiconductor structure 100 associated with input/output fin 114 (i.e. the second portion of the second oxide layer 142). However, as illustrated in FIG. 2F, photoresist 170 is not applied over the surface of the second oxide layer 142 in a region of semiconductor structure associated with core fin 112 (i.e. the first portion of the second oxide layer 142). The application of photoresist 170 in this manner provides the ability to remove the first oxide layer 141 and the second oxide layer 142 in a region of semiconductor structure 100 adjacent core fin 112 but not in a region semiconductor structure 100 adjacent input/output fin 114. A variety of different types of suitable materials can be used to implement photoresist 170, and photoresist 170 can be applied in step 205 in a variety of suitable manners.

After step 205, a variety of suitable steps may be performed to treat photoresist 170 before the removal step 206 discussed below. For example, a descum process can be used to remove any residual scum that may be left on photoresist 170 after application. The removal of this residual scum can facilitate improvements in the removal step 206. Photoresist 170 can further be treated using solutions such as deionized water (DIW) and other suitable solutions before process 200 proceeds to step 206.

Figure 2G:
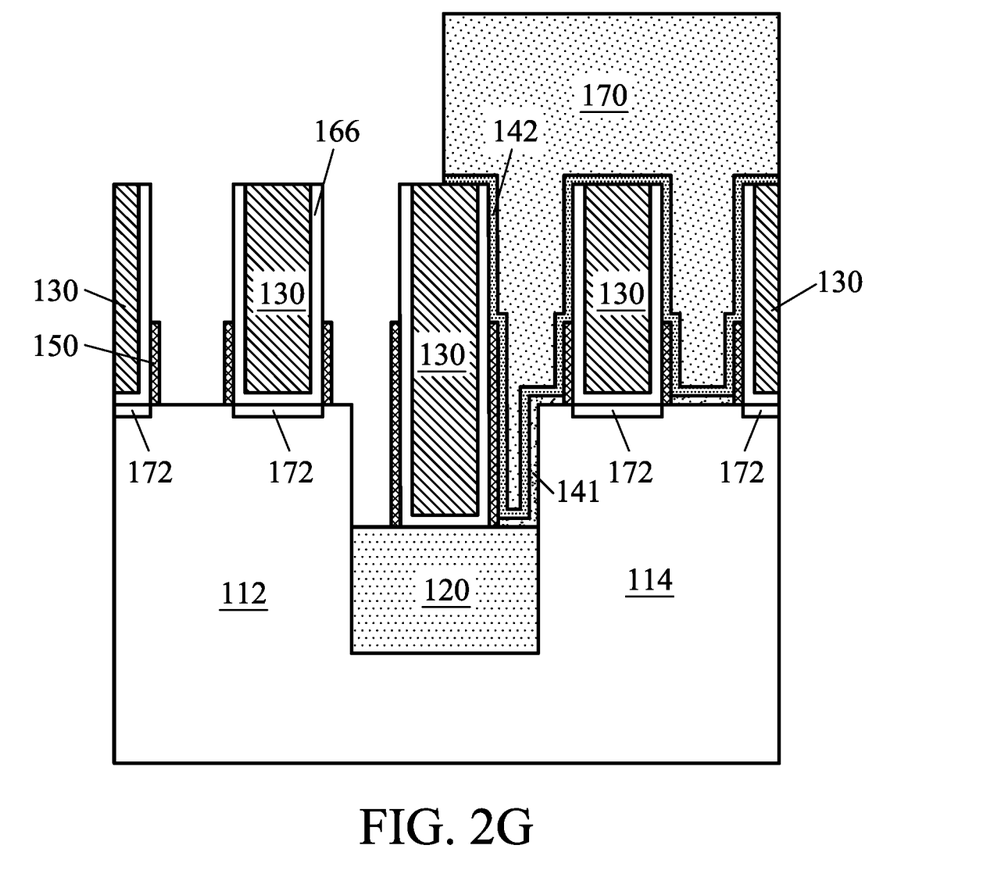

At a step 206, the first portion of the second oxide layer and the first oxide layer are removed (FIG. 2G). As illustrated in FIG. 2G, the first portion of the second oxide layer 142 is removed along with an adjacent portion of the first oxide layer 141. The first portion of the second oxide layer 142 and the adjacent portion of the first oxide layer 141 can be removed in step 206 using a variety of suitable processes, including both wet etching and dry etching processes. As a result of the first portion of the second oxide layer 142 and the adjacent portion of the first oxide layer 141 being removed in this manner in step 206, when a gate (e.g. a HKMG structure as discussed above and a gate oxide layer) is formed, the gate will be adjacent with core fin 112. Further, since the first oxide layer 141 and the second oxide layer 142 are protected by photoresist 170 in the region of semiconductor structure 100 associated with input/output fin 114, the first oxide layer 141 and the second oxide layer 142 are not removed in the region of semiconductor structure 100 associated with input/output fin 114 in step 206.

Figure 2H:
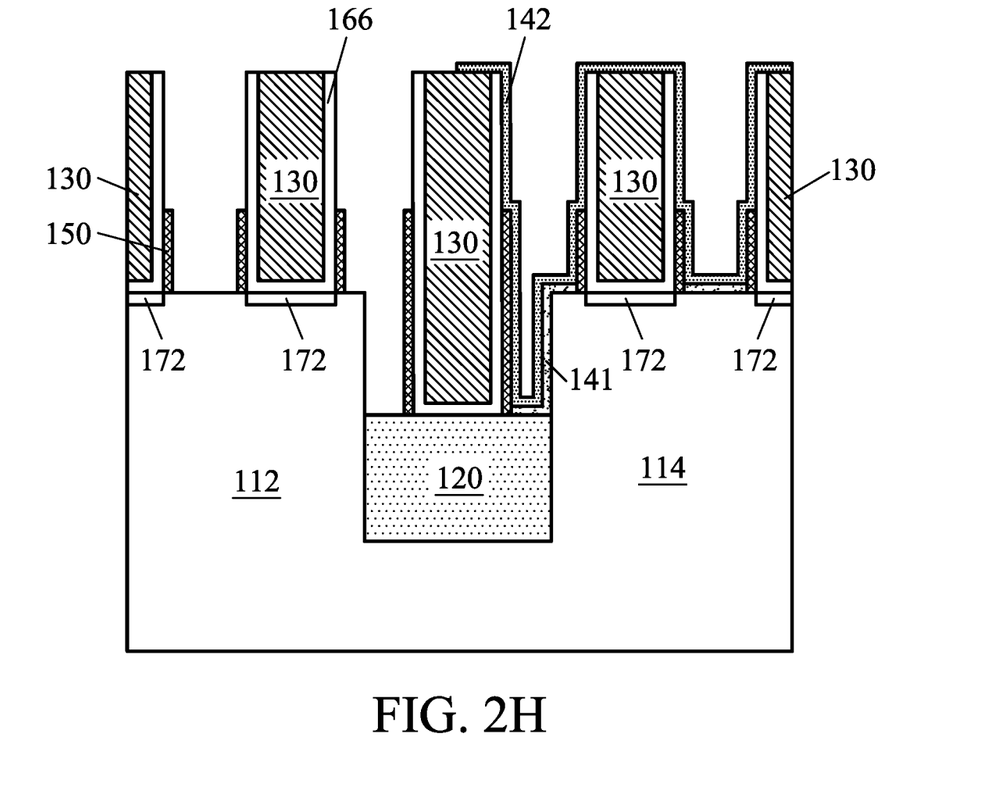

At a step 207, the photoresist is removed (FIG. 2H). As illustrated in FIG. 2H, photoresist 170 is removed. Photoresist 170 can be removed in step 207 using a variety of suitable processes, including both wet etching and dry etching processes. After step 207, process 200 is generally complete, however the FEOL portion of the IC fabrication process continues. Notably, a gate such as a HKMG structure is formed as well as epitaxial regions for source and drain terminals. Additionally, contacts are formed on the gate, source, and drain terminals, and an interconnect structure is formed to connect individual semiconductor devices before packaging steps occur. After process 200, a strong and reliable composite oxide layer including both the first oxide layer 141 and the second oxide layer 142 is formed adjacent input/output fin 114.

It will be appreciated that various adaptations to process 200 are contemplated within the scope of the present disclosure. For example, composite oxide layers such as discussed herein can be formed in a variety of different semiconductor applications. These composite oxide layers do not have to be formed after removing a dummy gate as discussed in the examples provided herein, but rather the skilled person will appreciate that similar composite oxide layers can be used in a variety of ways in view of the present disclosure.

As described in detail above, the present disclosure provides a semiconductor structure and method for fabricating a semiconductor structure including use of two separate oxide layers to improve device reliability. A first oxide layer is formed adjacent a fin, a dummy gate is formed adjacent the first oxide layer, the dummy gate is removed, and a second oxide layer is then formed adjacent the first oxide layer. The use of the second oxide layer can improve device reliability by covering any damage that may be inflicted on the first oxide layer when the dummy gate is removed.

An implementation of the present disclosure is a semiconductor structure. The semiconductor structure includes a fin, an isolation structure adjacent the fin, a dielectric layer adjacent the isolation structure, a first oxide layer adjacent the fin, the isolation structure, and the dielectric layer, and a second oxide layer adjacent the first oxide layer. The first oxide layer and the second oxide layer defining a composite oxide layer, wherein a horizontal portion of the composite oxide layer is thicker than a vertical portion of the composite oxide layer.

Another implementation of the present disclosure is a method of fabricating a semiconductor structure. The method includes forming a first oxide layer adjacent a fin, forming a dummy gate adjacent the first oxide layer, removing the dummy gate, forming a second oxide layer adjacent the first oxide layer, and forming a gate adjacent the second oxide layer.

Yet another implementation of the present disclosure is another method of fabricating a semiconductor structure. The method includes forming a first oxide layer adjacent a first fin and adjacent a second fin, where the first fin is an input/output fin and the second fin is a core fin, forming a dummy gate adjacent the first oxide layer, removing the dummy gate, forming a second oxide layer adjacent the first oxide layer, removing a portion of the second oxide layer and a portion of the first oxide layer, and forming a gate adjacent the second oxide layer and adjacent the second fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor structure, comprising:
    forming a first oxide layer adjacent a fin;
    forming a dummy gate adjacent the first oxide layer;
    removing the dummy gate;
    forming a second oxide layer adjacent the first oxide layer; and
    forming a gate adjacent the second oxide layer,
    wherein forming the second oxide layer adjacent the first oxide layer comprises forming the second oxide layer adjacent the first oxide layer subsequent to removing the dummy gate such that a thickness of the second oxide layer is greater than a thickness of the first oxide layer, wherein the fin comprises a first fin, the semiconductor structure further comprises a second fin, and the method further comprises removing a portion of the second oxide layer adjacent the second fin and a portion of the first oxide layer before forming the gate.

2. The method of claim 1, wherein forming the first oxide layer further comprises forming the first oxide layer adjacent an isolation structure and adjacent a dielectric layer.

3. The method of claim 1, wherein:
    the first fin is an input/output fin and the second fin is a core fin;
    forming the first oxide layer comprises forming the first oxide layer adjacent the first fin and the second fin.

4. The method of claim 3, wherein forming the gate comprises forming the gate adjacent the second fin.

5. The method of claim 3, wherein the portion of the second oxide layer comprises a first portion of the second oxide layer, the method further comprising applying a photoresist over a second portion of the second oxide layer before removing the first portion of the second oxide layer and the portion of the first oxide layer.

6. The method of claim 1, wherein forming the dummy gate comprises forming the dummy gate using polysilicon, and wherein removing the dummy gate comprises removing the dummy gate using both a dry etching process and a wet cleaning process.

7. The method of claim 1, wherein forming the dummy gate comprises forming the dummy gate using polysilicon, and wherein removing the dummy gate comprises removing the dummy gate using both a dry etching process and a wet cleaning process.

8. The method of claim 2, further comprising removing a portion of a spacer layer formed adjacent the dielectric layer before removing the dummy gate.

9. The method of claim 1, wherein the dummy gate comprises polysilicon.

10. A method of fabricating a semiconductor structure, comprising:
    forming a first oxide layer adjacent a first fin and adjacent a second fin, the first fin comprising an input/output fin and the second fin comprising a core fin;
    forming a dummy gate adjacent the first oxide layer;
    removing the dummy gate;
    forming a second oxide layer adjacent the first oxide layer;
    removing a portion of the second oxide layer and a portion of the first oxide layer; and
    forming a gate adjacent the second oxide layer and adjacent the second fin,
    wherein forming the second oxide layer adjacent the first oxide layer comprises forming the second oxide layer adjacent the first oxide layer subsequent to removing the dummy gate such that a thickness of the second oxide layer is greater than a thickness of the first oxide layer, wherein the portion of the second oxide layer comprises a first portion of the second oxide layer, and the method further comprising applying a photoresist over a second portion of the second oxide layer before removing the first portion of the second oxide layer and the portion of the first oxide layer.

11. The method of claim 10, wherein forming the first oxide layer further comprises forming the first oxide layer, such that the first oxide layer is adjacent an isolation structure and adjacent a dielectric layer.

12. The method of claim 10, wherein forming the dummy gate comprises forming the dummy gate using polysilicon, and wherein removing the dummy gate comprises removing the dummy gate using both a dry etching process and a wet cleaning process.

13. The method of claim 11, further comprising removing a portion of a spacer layer formed adjacent the dielectric layer before removing the dummy gate.

14. The method of claim 10, wherein removing the portion of the second oxide layer and the portion of the first oxide layer comprises removing the portion of the second oxide layer and the portion of the first oxide layer using a dry etching process.

15. The method of claim 10, wherein removing the portion of the second oxide layer and the portion of the first oxide layer comprises removing the portion of the second oxide layer and the portion of the first oxide layer using an etching process.

16. A method of fabricating a semiconductor structure, comprising:
    forming a first oxide layer adjacent a first fin and a second fin;
    forming a dummy gate adjacent the first oxide layer;
    removing the dummy gate;
    forming a second oxide layer adjacent the first oxide layer subsequent to removing the dummy gate such that a thickness of the second oxide layer is greater than a thickness of the first oxide layer;
    forming a gate adjacent the second oxide layer; and
    removing a portion of the second oxide layer adjacent the second fin and a portion of the first oxide layer before forming the gate.

17. The method of claim 16, wherein forming the gate comprises forming the gate adjacent the second fin.

18. The method of claim 16, wherein the portion of the second oxide layer comprises a first portion of the second oxide layer, the method further comprising applying a photoresist over a second portion of the second oxide layer before removing the first portion of the second oxide layer and the portion of the first oxide layer.

19. The method of claim 16, wherein forming the dummy gate comprises forming the dummy gate using polysilicon, and wherein removing the dummy gate comprises removing the dummy gate using both a dry etching process and a wet cleaning process.

20. The method of claim 16, wherein the dummy gate comprises polysilicon.

* * * * *